(12) United States Patent
Chen et al.

(10) Patent No.: US 6,823,293 B2
(45) Date of Patent: Nov. 23, 2004

(54) HIERARCHICAL POWER SUPPLY NOISE MONITORING DEVICE AND SYSTEM FOR VERY LARGE SCALE INTEGRATED CIRCUITS

(75) Inventors: Howard H. Chen, Yorktown Heights, NY (US); Louis Lu-Chen Hsu, Fishkill, NY (US); Brian L. Ji, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 10/334,312

(22) Filed: Dec. 31, 2002

(65) Prior Publication Data

US 2004/0128115 A1 Jul. 1, 2004

(51) Int. Cl.[7] ............................................. G06F 15/00
(52) U.S. Cl. ..................... 702/191; 324/763; 326/23; 326/26; 714/724
(58) Field of Search ........................... 702/117, 190, 702/191, 193; 714/724; 324/763; 326/21, 23, 24; 327/565

(56) References Cited

U.S. PATENT DOCUMENTS

| | | | | |
|---|---|---|---|---|
| 3,774,053 A | * | 11/1973 | Carlson | 326/23 |
| 4,857,765 A | * | 8/1989 | Cahill et al. | 326/26 |
| 5,453,713 A | * | 9/1995 | Partovi et al. | 327/565 |
| 5,550,840 A | * | 8/1996 | O'Brien | 714/724 |
| 6,628,135 B2 | * | 9/2003 | Gauthier et al. | 324/763 |

* cited by examiner

Primary Examiner—John Barlow
Assistant Examiner—John Le
(74) Attorney, Agent, or Firm—Scully, Scott, Murphy & Presser; Louis J. Percello, Esq.

(57) ABSTRACT

A hierarchical power supply noise monitoring device and system for very large scale integrated circuits. The noise-monitoring device is fabricated on-chip to measure the noise on the chip. The noise-monitoring system includes a plurality of on-chip noise-monitoring devices distributed strategically across the chip. A noise-analysis algorithm analyzes the noise characteristics from the noise data collected from the noise-monitoring devices, and a hierarchical noise-monitoring system maps the noise of each core to the system on chip.

24 Claims, 12 Drawing Sheets

Figure 4. Noise pulse output regions.

Figure 6. Reference voltage scanning mechanisms.
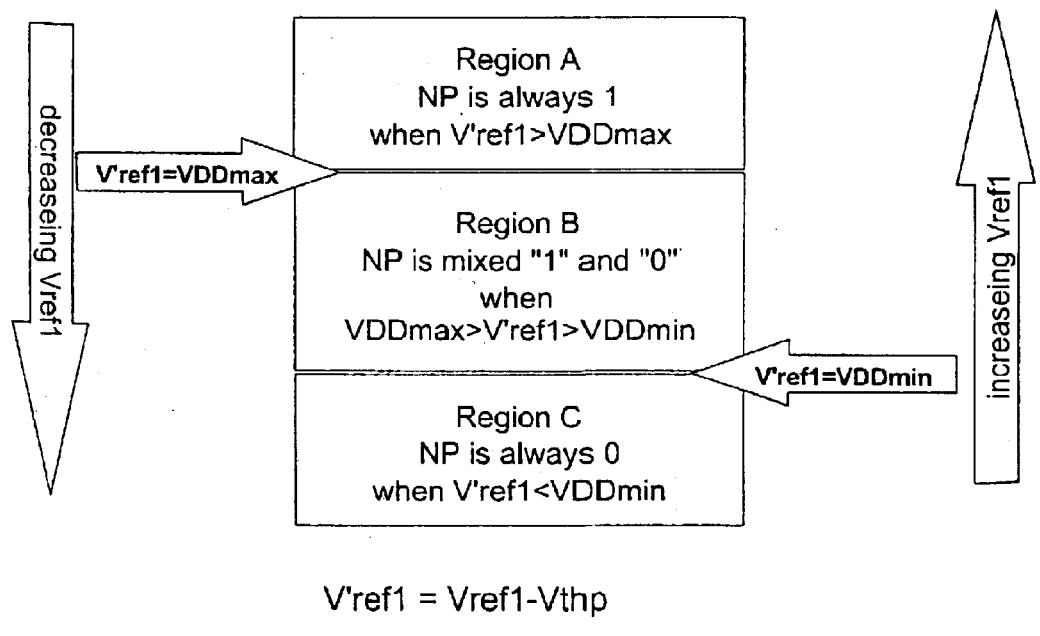
V'ref1 = Vref1-Vthp

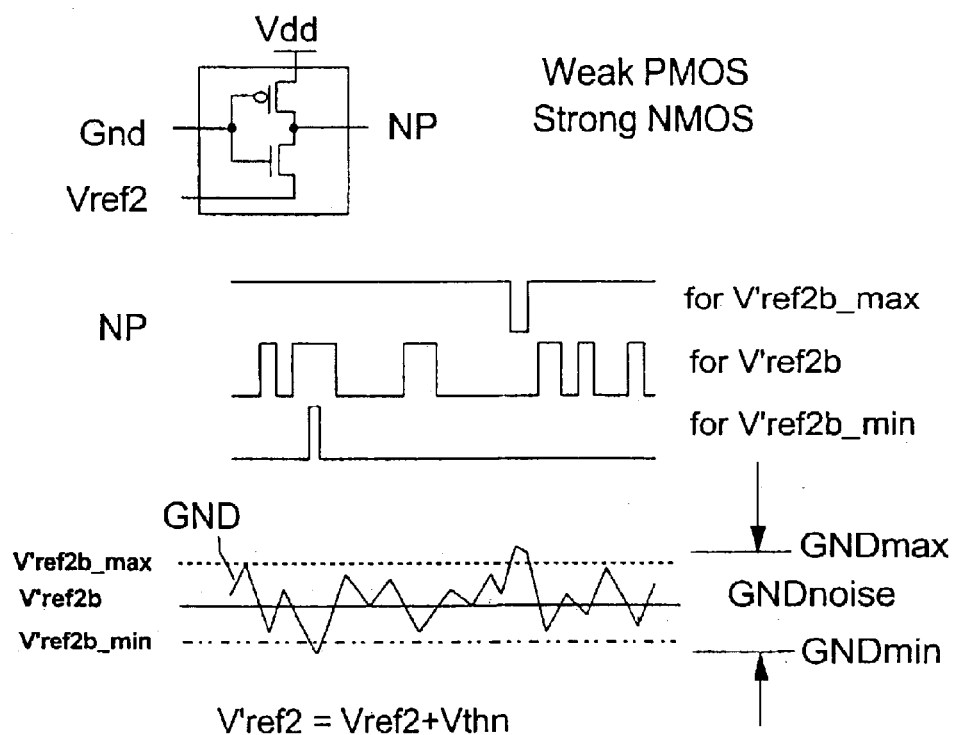
Figure 7. Circuit schematics of ground noise monitor.

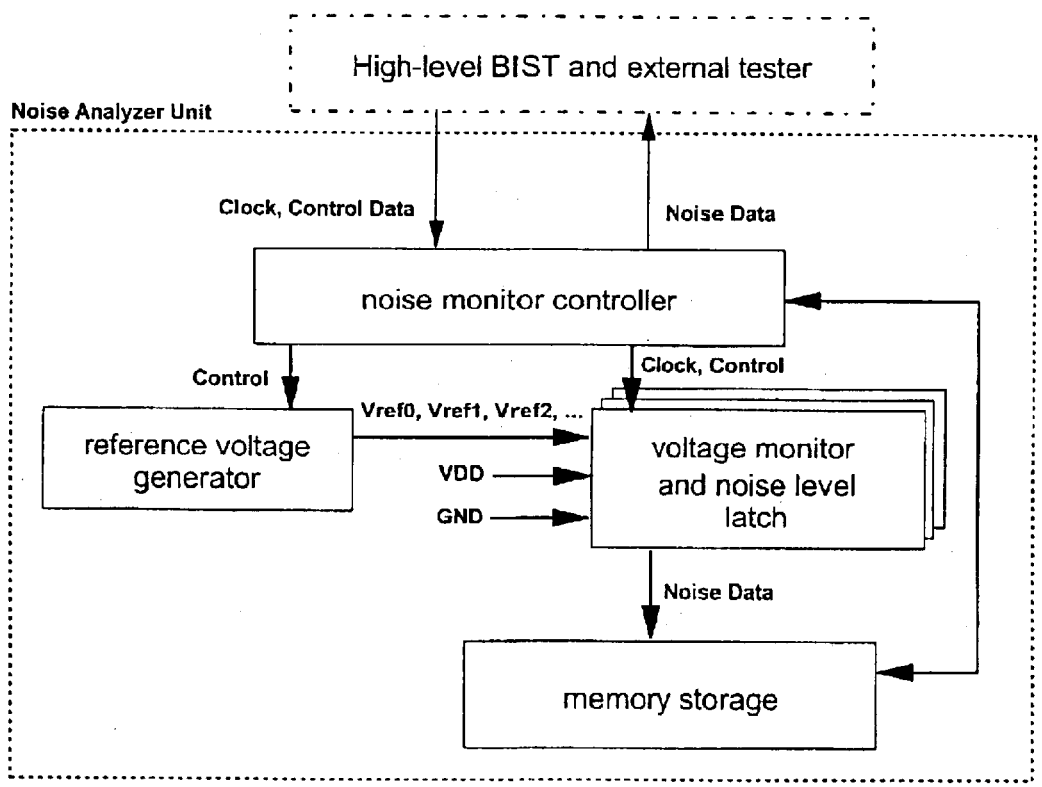
Figure 8. Noise-monitoring system.

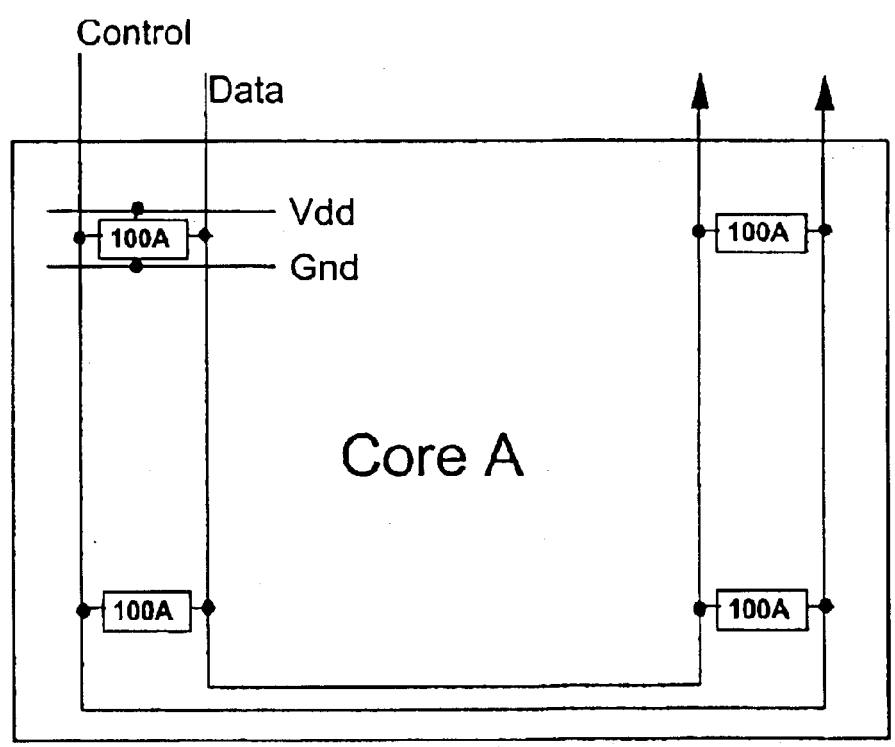
Figure 9A. In-core noise-monitoring system 200A.

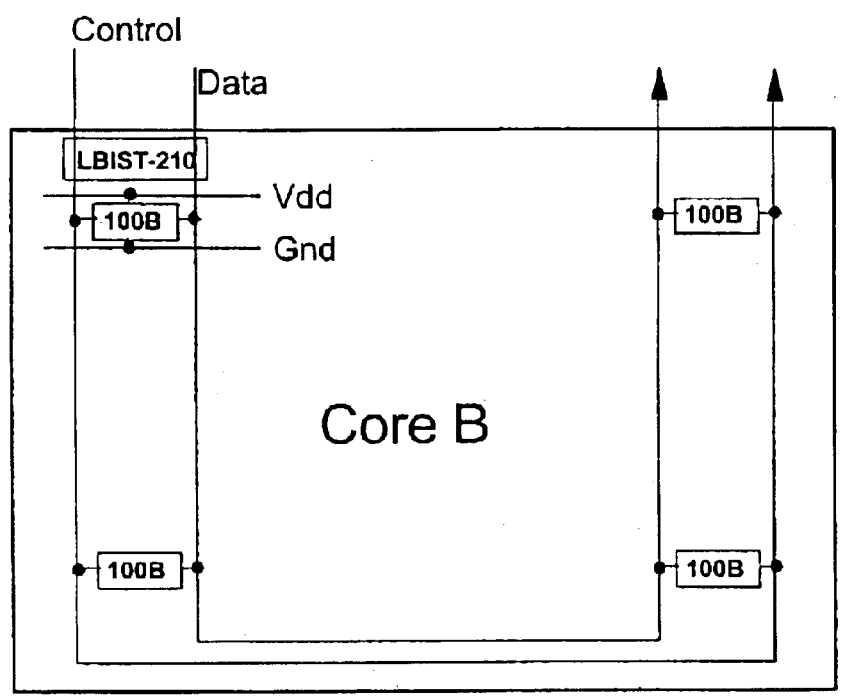
Figure 9B. In-core noise-monitoring system 200B.

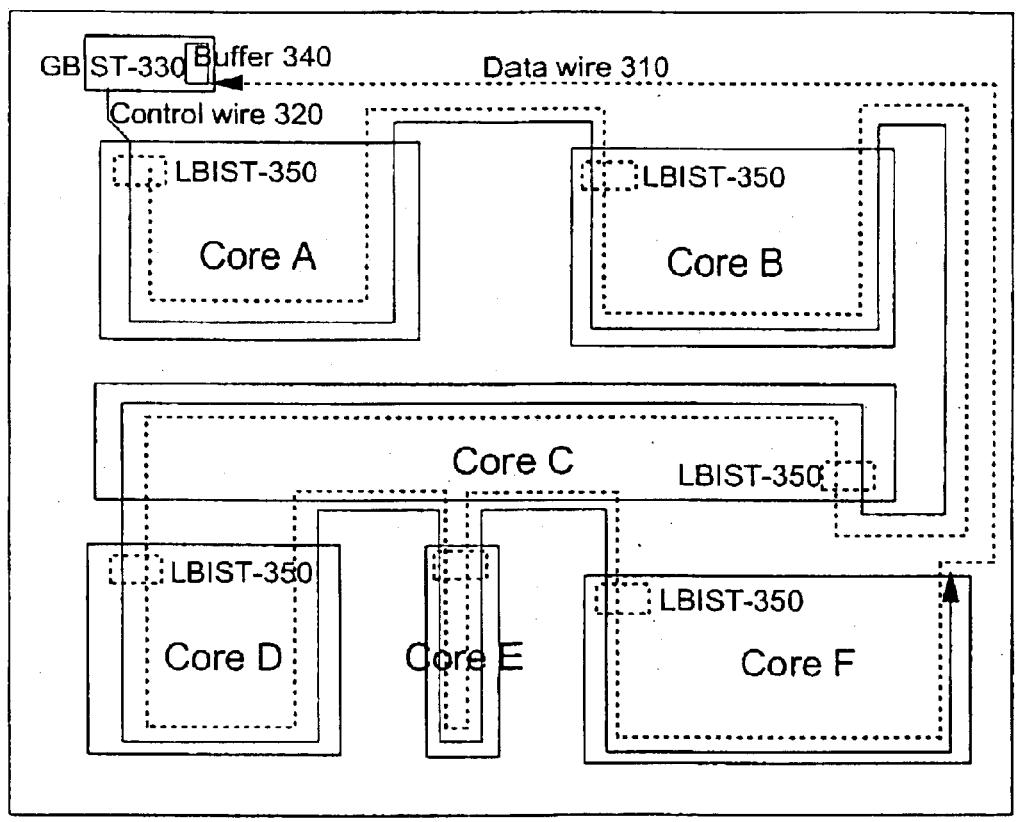
Figure 10A. SOC noise analyzer protocol 300.

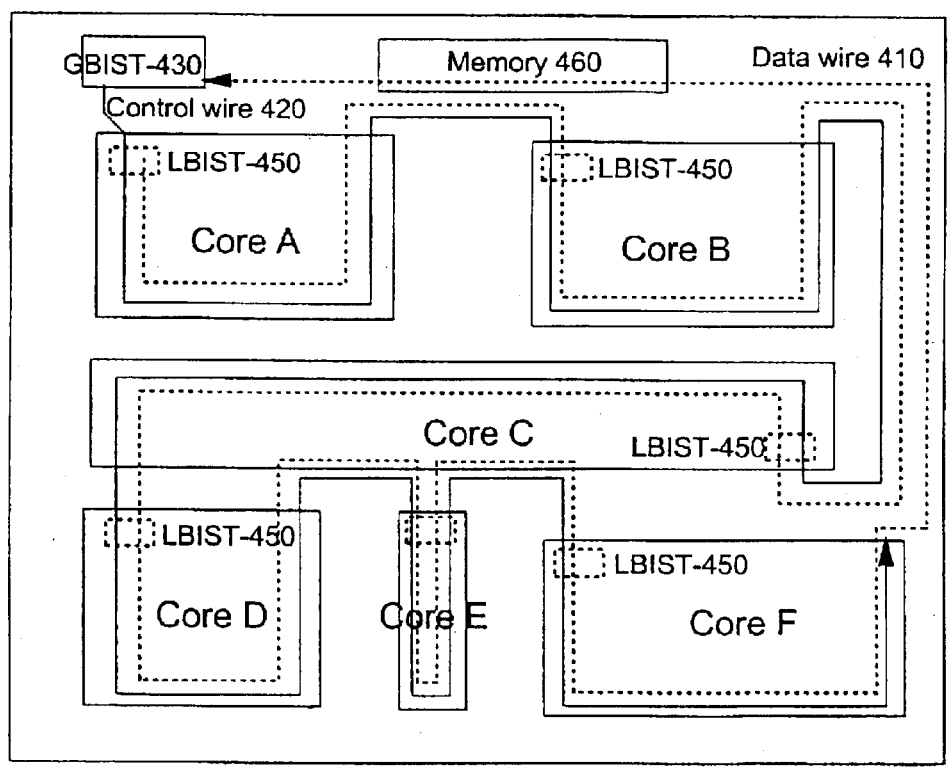
Figure 10B. SOC noise analyzer protocol 400.

HIERARCHICAL POWER SUPPLY NOISE MONITORING DEVICE AND SYSTEM FOR VERY LARGE SCALE INTEGRATED CIRCUITS

BACKGROUND OF THE INVENTION

The present invention relaters generally to a hierarchical power supply noise monitoring device and system for very large scale integrated circuits. The noise-monitoring device is fabricated on-chip to measure the noise on the chip. The noise-monitoring system comprises a plurality of on-chip noise-monitoring devices distributed strategically across the chip. A noise-analysis algorithm analyzes the noise characteristics from the noise data collected from the noise-monitoring devices, and a hierarchical noise-monitoring system maps the noise of each core to the system on chip.

The advent of deep sub-micron technology has brought noise and signal integrity issues into the spotlight. The noise immunity issue is arguably more important than other design metrics such as area, timing and power, because if a circuit fails, it does not matter how small the circuit is, how fast it runs, or how little power it consumes. Therefore, to preserve signal integrity, every circuit must have a built-in noise margin to allow for possible signal degradation.

The noise problems for VLSI systems include leakage noise, charge-sharing noise, cross-talk noise, reflection noise and power supply noise. Leakage noise is due to the sub-threshold current of transistors. Charge-sharing noise is produced by the charge redistribution between the internal nodes and external nodes of a circuit. Cross-talk noise is the coupling noise between adjacent wires. Reflection noise occurs at each impedance discontinuity on a transmission line. Finally, power supply noise is the switching noise on the power supply lines, which is subsequently coupled onto the evaluation nodes of a circuit. For an under-damped low-loss network, the power supply noise problem can manifest itself in the form of a slowly decaying transient noise, or a potentially more dangerous resonance noise. As the power supply voltage and threshold voltage continue to scale down in deep sub-micron design, the noise margin will become very small, and control of power supply noise will be critical to determine the performance and reliability of very large scale integrated (VLSI) circuits.

Power supply noise can be simulated by modeling the inductance, resistance and capacitance of the power distribution network [H. Chen and D. Ling, "Power supply noise analysis methodology for deep-submicron VLSI chip design," Design Automation Conference, June 1997, pp. 638–643]. However, it is difficult to verify the accuracy of simulation results without the actual hardware measurement data. Furthermore, for system-on-chip design, analog circuits, which are more susceptible to noise, may have multiple supply voltages that must be isolated from the digital circuits and analyzed separately [Y. Kashima et al., "An evaluation method for substrate noise in AD mixed-signal LSIs", Technical report of IEICE, IDC97–110, August 1997].

To calibrate the simulation model and provide a better estimate of the power supply noise, hardware measurement can be performed by using an amplification circuit to send the analog noise waveform off chip to an external tester [Hamid Partovi and Andrew J. Barber, "Noise-free analog islands in digital integrated circuits", U.S. Pat. No. 5,453, 713]. This method is difficult to implement, however, due to the resolution required to measure high-frequency noise, and the large number of noise sources that need to be monitored. To minimize the possible noise interference in an analog circuit, a sampling method and multiple voltage comparators can be used to send the output to a digital tester [H. Aoki, M. Ikeda, and K. Asada, "On-chip voltage noise monitor for measuring voltage bounce in power supply lines using a digital tester", International Conference on Microelectronic Test Structures, March 2000, pp. 112–117].

Unfortunately, the use of clocks in the sampling circuit will limit the time resolution of noise measurement. The use of voltage comparators may also introduce uncertainty on the reference voltage due to the additional voltage drops.

SUMMARY OF THE INVENTION

Accordingly, it is a primary object of the present invention to provide a hierarchical power supply noise monitoring device and system for very large scale integrated circuits. The noise-monitoring device is fabricated on-chip to measure the noise on the chip. The noise-monitoring system comprises a plurality of on-chip noise-monitoring devices distributed strategically across the chip. A noise-analysis algorithm analyzes the noise characteristics from the noise data collected from the noise-monitoring devices, and a hierarchical noise-monitoring system maps the noise of each core to the system on chip.

BRIEF DESCRIPTION OF THE DRAWINGS

The foregoing objects and advantages of the present invention for a hierarchical power supply noise monitoring device and system for very large scale integrated circuits may be more readily understood by one skilled in the art with reference being had to the following detailed description of several embodiments thereof taken in conjunction with the accompanying drawings wherein like elements are designated by identical reference numerals throughout the several views, and in which:

FIG. 6 shows two reference voltage scanning mechanisms to detect the VDD noise boundaries.

FIG. 7 is a high level block circuit diagram of the ground noise monitor GNM.

FIG. 8 is a high level block circuit diagram of a noise-monitoring system comprising a noise monitor controller, a reference voltage generator, a voltage monitor and noise-level latch, and a memory storage unit.

FIG. 9A shows an in-core noise-monitoring system for a core A, wherein a plurality of noise analyzer units NAU measure the local power supply noise.

FIG. 9B shows an alternative embodiment of an in-core noise-monitoring system for a core B, wherein a plurality of noise analyzer units NAU measure the local power supply noise.

FIG. 10A shows a system-on-chip (SOC) noise analyzer protocol comprising 6 cores and a global built-in-self-test unit GBIST.

FIG. 10B shows an alternative embodiment of an SOC noise analyzer protocol that employs an existing memory core to store the noise data.

DETAILED DESCRIPTION OF THE INVENTION

In the present invention, a noise-monitoring device is fabricated on-chip to measure the noise on the chip. A noise-monitoring system comprises a plurality of such on-chip noise-monitoring devices distributed strategically across the chip. A noise-analysis algorithm analyzes the noise characteristics from the noise data collected from the noise-monitoring devices, and a hierarchical noise-monitoring system maps the noise of each core to the system on chip.

A high-resolution on-chip noise-monitoring device is designed inside each macro. The noise of each individual macro is monitored in parallel or in sequence to measure the noise interference between different macros. A hierarchical noise-monitoring system monitors and stores the supply noise information for each core and each chip, as part of the built-in-self-test (BIST) system. This approach can be further extended from system on chip to system on package to provide a full spectrum of noise testing in a hierarchical manner.

(A) On-chip Noise Analyzer Unit and Noise-monitoring Device

An on-chip noise analyzer unit (NAU) is provided to monitor the characteristics of power supply and ground noise on the chip. Each NAU is controlled by a higher level built-in-self-test (BIST) unit or an external tester, and each NAU measures the noise in signal or power bus lines.

Figure 1A:
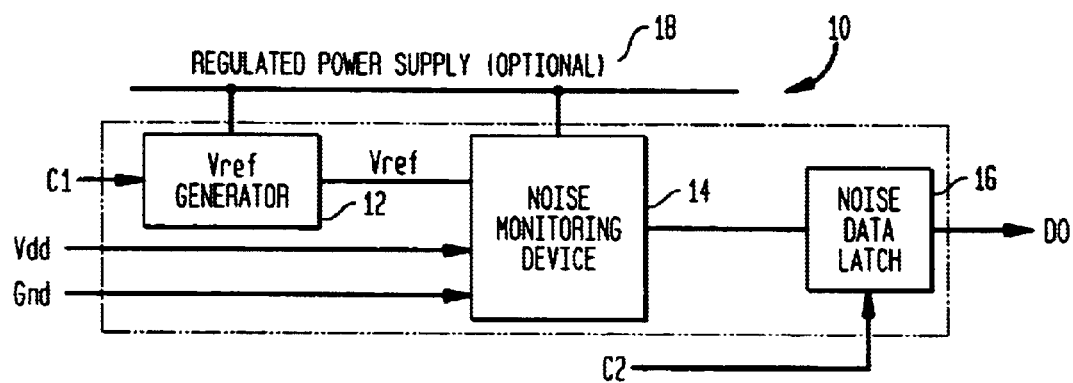
FIG. 1A is a high level block circuit diagram of a noise analyzer unit (NAU) comprising a reference voltage generator which supplies references voltages Vref, a noise-monitoring device, a noise data latch, and an optional regulated power supply.
Figure 1B:
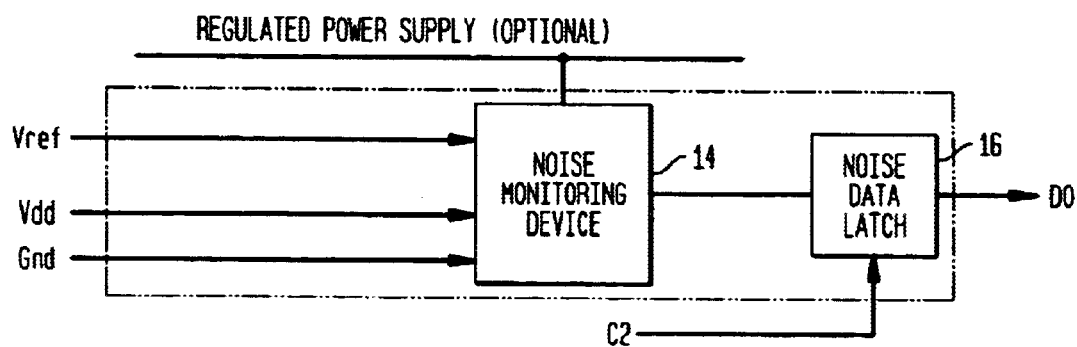
FIG. 1B is a high level block circuit diagram of an alternative embodiment of a noise analyzer unit NAU with an externally shared reference voltage generator supplying a shared reference voltage Vref.

FIG. 1A is a high level block circuit diagram of a noise analyzer unit (NAU) comprising a reference voltage generator which supplies references voltages Vref, a noise-monitoring device, a noise data latch, and an optional regulated power supply. The supply voltage (VDD) and ground (GND) voltage are monitored by the noise-monitoring device 14 and compared to the reference voltages supplied by the regulated power supply 18. The reference voltages are controlled by a first control signal C1, and the output data are latched upon receiving a second control signal C2. FIG. 1B is a high level block circuit diagram of an alternative embodiment of a noise analyzer unit NAU with an externally shared reference voltage generator supplying a shared reference voltage Vref, which saves circuit area and power.

Figure 1C:
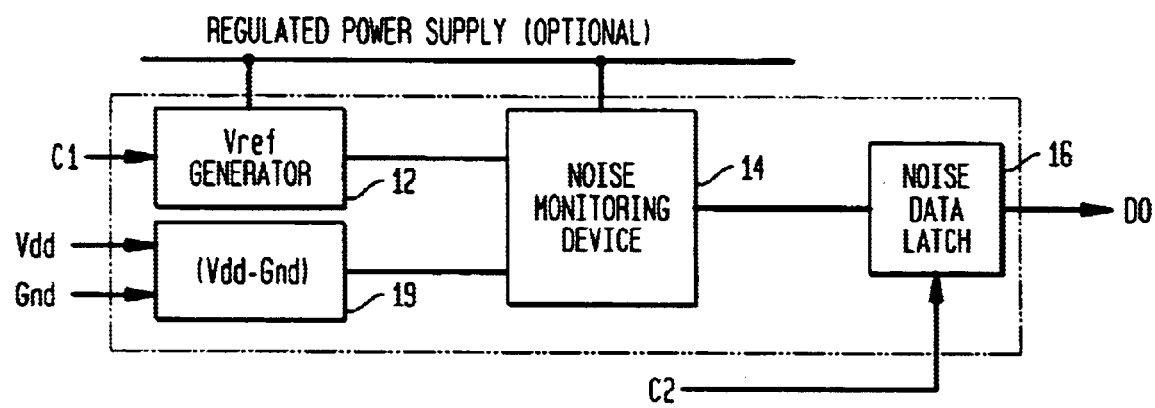
FIG. 1C is a high level block circuit diagram of a third embodiment of a noise analyzer unit NAU wherein the voltage differential between VDD and GND is measured.

FIG. 1C is a high level block circuit diagram of a third embodiment of a noise analyzer unit NAU wherein the voltage differential between VDD and GND is measured.

Figure 2:
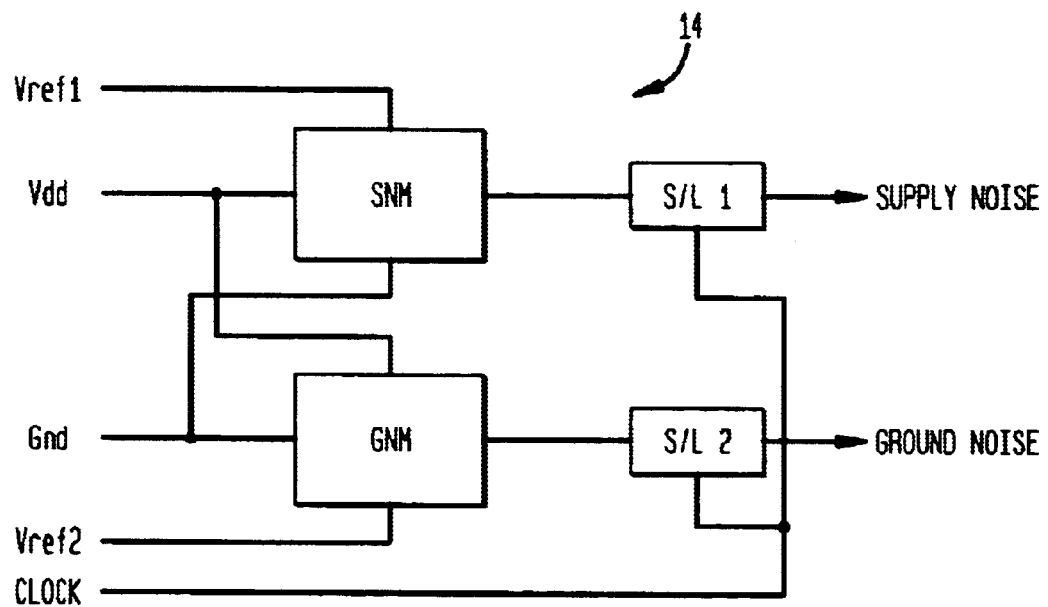
FIG. 2 is a high level block circuit diagram of an integrated noise-monitoring device, comprising one supply noise monitor (SNM), one ground noise monitor (GNM), one clock signal, two voltage reference levels (Vref1 and Vref2), and two sampling latches (S/L 1 and S/L 2).

FIG. 2 is a high level block circuit diagram of an integrated noise-monitoring device, comprising one supply noise monitor (SNM), one ground noise monitor (GNM), one clock signal, two voltage reference levels (Vref1 and Vref2), and two sampling latches (S/L 1 and S/L 2). The power supply voltage VDD is monitored by the SNM and measured against the reference voltage Vref1. The ground voltage GND is monitored by the GNM and measured against the reference voltage Vref2. The supply noise pulses generated by the SNM are sampled by the latch S/L1, and the ground noise pulses generated by the GNM are sampled by the latch S/L2 in the noise-monitoring system.

Figure 3:
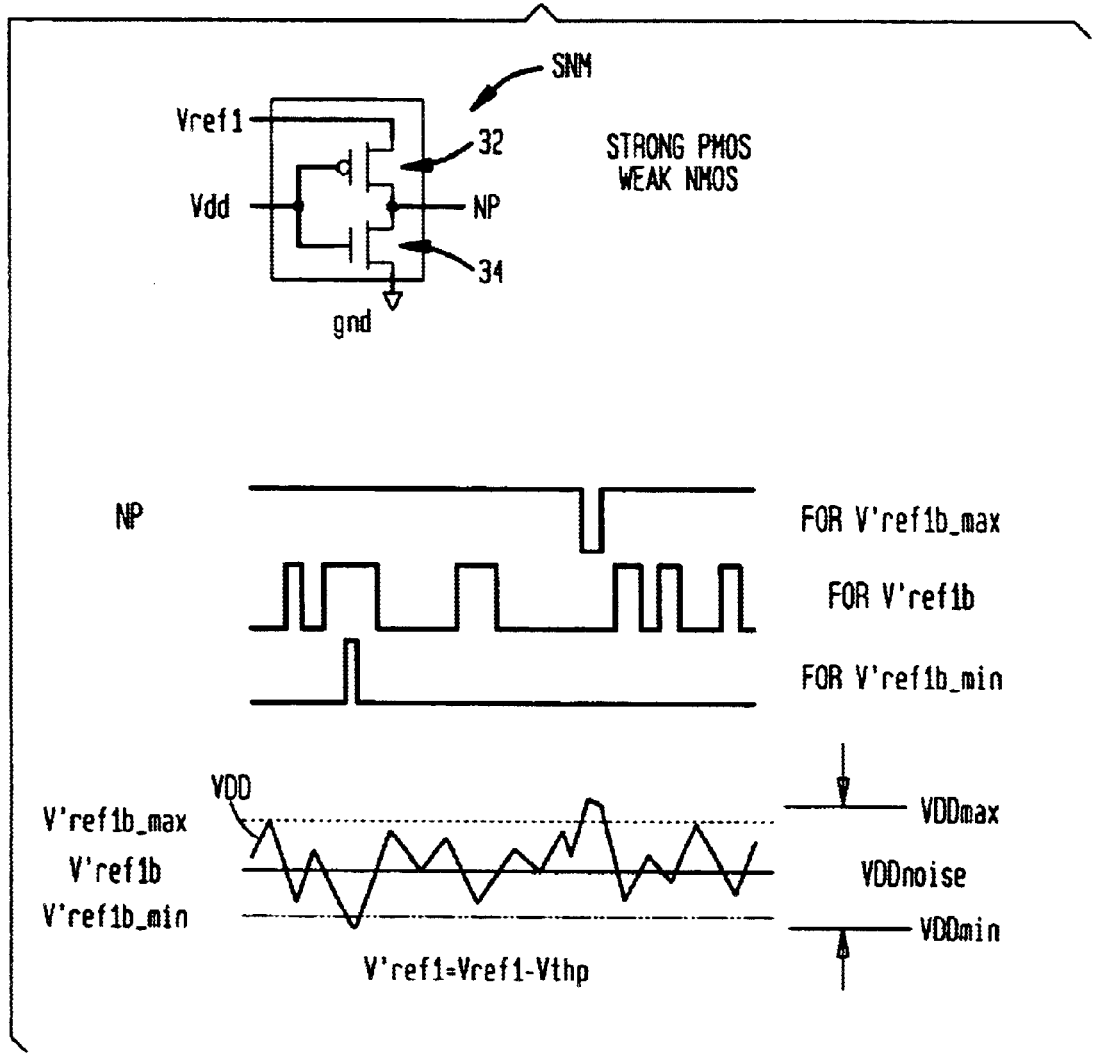
FIG. 3 is a circuit schematic and illustrative waveforms of the supply noise monitor SNM.

FIG. 3 is a circuit schematic and illustrative waveforms of the supply noise monitor SNM which comprises a strong pMOS device and a weak nMOS device that are connected as an inverter, where the source and the body of the pMOS device are connected to Vref1, the source and the body of the nMOS device are connected to GND, the gates of the pMOS and nMOS devices are connected to VDD, and the drains of the pMOS and nMOS devices are connected to a noise pulse output NP. To provide stronger driving power, the stronger pMOS device is designed with a wider channel, lower threshold voltage, or thinner gate oxide than the nMOS device.

By defining V'ref1=Vref1−Vthp, where Vthp is the threshold voltage of the pMOS device, if the VDD input is higher than V'ref1, the pMOS device is turned off, the nMOS device is turned on, and the NP output is GND. On the other hand, if VDD drops below V'ref1, the pMOS device is turned on by switching from weak inversion to strong inversion, and the NP output changes to Vref1because the pMOS device is designed to overpower the nMOS device.

Figure 4:
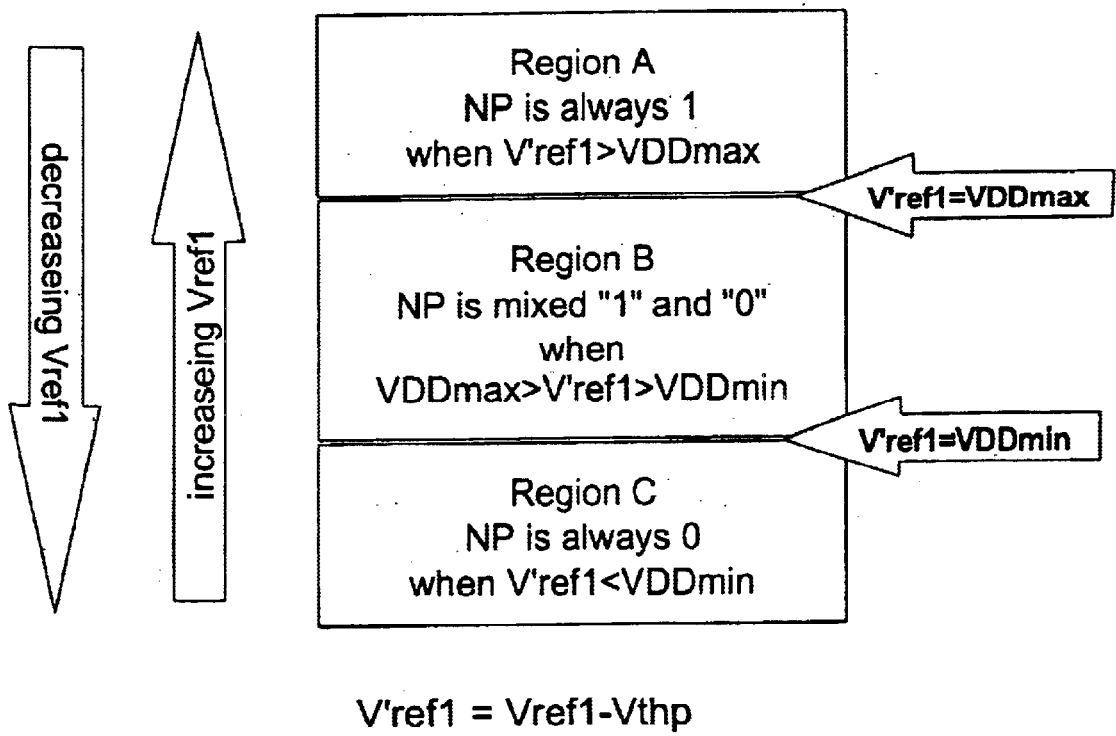
FIG. 4 illustrates that as the levels of the reference voltage Vref1 are adjusted, the SNM inverter output NP is generated in one of three distinct regions A, B, C, where NP is always 1 (high) in region A, always 0 (low) in region C, and alternates between 0 and 1 in region B.

As the levels of the reference voltage Vref1are adjusted, the SNM inverter output NP is generated in one of three distinct regions A, B, C shown in FIG. 4, where NP is always 1 (high) in region A, always 0 (low) in region C, and alternates between 0 and 1 in region B. When V'ref1=Vref1−Vthp is greater than the maximum supply voltage VDDmax, the output NP remains in region A and is always 1. When V'ref1 is less than the minimum supply voltage VDDmin, the output NP remains in region C and is always 0. Therefore, VDDmax can be identified by sweeping Vref1 through the boundary between region A and region B, and VDDmin can be identified by sweeping Vref1 through boundary between region B and region C. The width (height in FIG. 4) of region B, or VDDmax−VDDmin, thus defines the range of VDD noise fluctuations.

Figure 5:
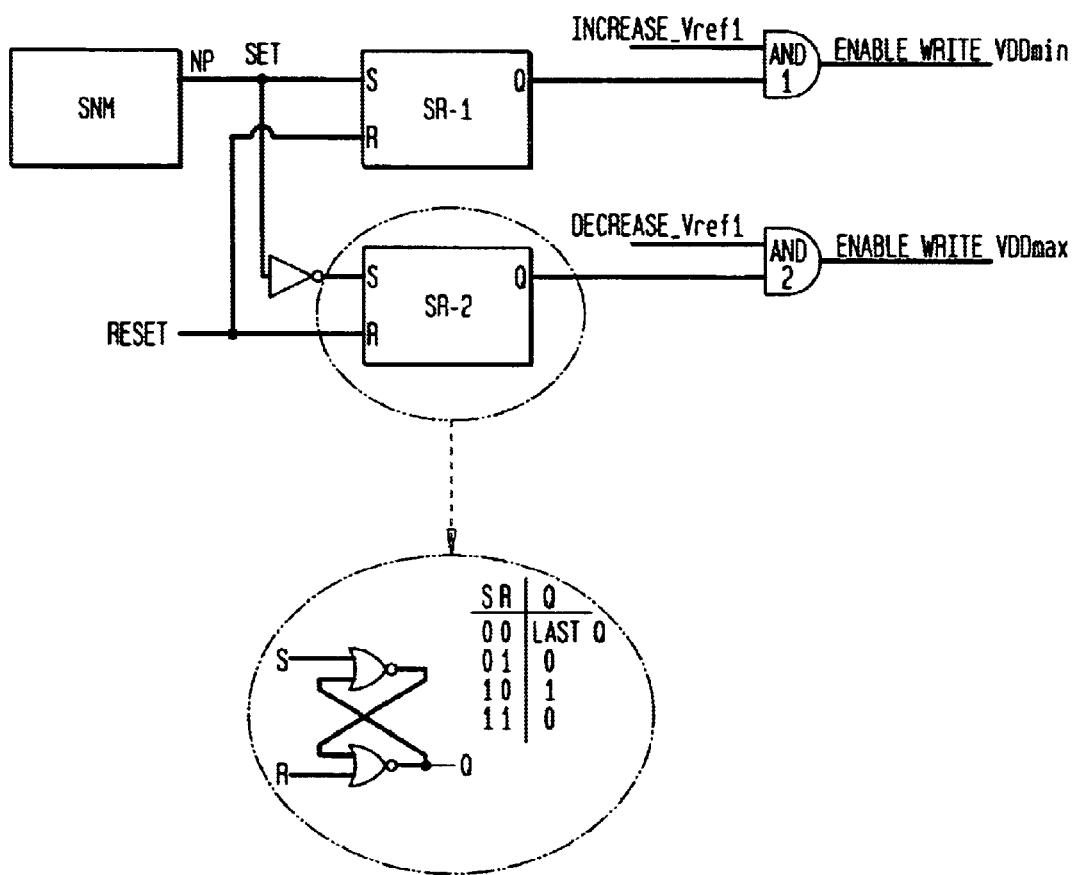
FIG. 5 is a circuit diagram of a set-reset (SR) sampling latch (S/L) to detect and record the boundary between regions A and B, as well as the boundary between regions B and C.

The noise pulse output signal NP from the supply noise monitor SNM is an input to the sampling latch S/L 1, FIGS. 2 and 5, which in turn triggers write-enable signals, Enable Write VDDmin and Enable Write VDDmax in FIG. 5, when the boundaries between regions A, B, and C are reached. These write-enable signals further enable recording of the VDDmax and VDDmin values into the memory, based on the corresponding Vref1 levels at the boundaries.

FIG. 5 is a circuit diagram of a set-reset (SR) sampling latch (S/L) to detect and record the boundary between regions A and B, as well as the boundary between regions B and C. The output NP of the supply noise monitor SNM forms a SET input to two set-reset sampling latches SR-1, SR-2, the outputs of which are input to two AND gates AND1, AND2. The second input to the first AND gate AND1 is reference signal. Increase_Vref1 which is adjusted upward step by step. The second input to the second AND gate AND2 is reference signal Decrease_Vref1 which is adjusted downward step by step. The first AND gate AND 1 generates the write-enable signal Enable Write VDDmin, and the second AND gate AND2 generates the write-enable signal Enable Write VDDmax. The SR sampling latch comprises two NOR gates connected as shown in the lower enlarged view (which also shows a truth table of operation), and the latch is triggered on the positive edge of the SET signal.

FIG. 6 shows two reference voltage scanning mechanisms to detect the VDD noise boundaries. In order to detect VDDmax, the reference voltage Vref1 is initially set to 1 (high), where V'ref1>>VDDmax, so that NP is always 1 in region A. As V'ref1 is adjusted downward step by step to just below VDDmax, a first 0 pulse will appear on the output node NP. This first appearance of 0 triggers a latch-enable signal to record the level of Vref1b_max, or V'ref1b max+Vthp, which corresponds to the boundary between regions A and B. If the step size of Vref1 is $\Delta V$, VDDmax can be approximated by the average of (Vref1b_max+$\Delta V$−Vthp) and (Vref1b_max−Vthp), which equals [Vref1b_max−Vthp+($\Delta V$/2)].

On the other hand, in order to detect VDDmin, the reference voltage Vref1 is initially set to 0 (low), where V'ref1<<VDDmin, so that NP is always 0 in region C. As V'ref1 is adjusted upward step by step to just above VDDmin, a first 1 pulse will appear on the output node NP. This first appearance of 1 triggers a latch-enable signal to record the level of Vref1b_min, or V'ref1b_min+Vthp, which corresponds to the boundary between regions B and C. If the step size of Vref1is $\Delta V$, VDDmin can be approximated by the average of (Vref1b_min−$\Delta V$−Vthp) and (Vref1b_min−Vthp), which equals [Vref1b_min−Vthp−($\Delta V$/2)]. The resulting range of VDD noise fluctuations can be calculated from (VDDmax−VDDmin), which equals (Vref1b_max−Vref1b_min+$\Delta V$). Similarly, FIG. 7 is a high level block circuit diagram of the ground noise monitor GNM comprising a strong nMOS device and a weak pMOS device that are connected as an inverter, where the source and the body of the pMOS device are connected to VDD, the source and the body of the nMOS device are connected to Vref2, the gates of the pMOS and nMOS devices are connected to GND, and the drains of the pMOS and nMOS devices are connected to the noise pulse output NP. The nMOS device is designed with stronger driving power than the pMOS device.

By defining V'ref2=Vref2+Vthn, where Vthn is the threshold voltage of the nMOS device, if the GND input is lower than V'ref2, the nMOS device is turned off, the pMOS device is turned on, and the NP output is VDD. On the other hand, if GND rises above V'ref2, the nMOS device is turned on by switching from weak inversion to strong inversion, and the NP output changes to Vref2 because the nMOS device is designed to overpower the pMOS device.

As the levels of the reference voltage Vref2 are adjusted, the GNM inverter output NP is also generated in one of three distinct regions, where NP is always 1 (high) in region A, always 0 (low) in region C, and alternates between 0 and 1 in region B. When V'ref2=Vref2+Vthn is greater than the maximum ground voltage GNDmax, the output NP remains in region A and is a 1. When V'ref2 is less than the minimum supply voltage GNDmin, the output NP remains in region C and is a 0. Therefore, GNDmax can be identified by sweeping Vref2 through the boundary between region A and region B, and GNDmin can be identified by sweeping Vref2 through the boundary between region B and region C. The width of region B, or GNDmax−GNDmin, thus defines the range of GND noise fluctuations.

In order to detect GNDmax, the reference voltage Vref2 is initially set to 1 (high), where V'ref2>>GNDmax, so that NP is always 1 in region A. As V'ref2 is adjusted downward step by step to just below GNDmax, a first 0 pulse will appear on the output node NP. This first appearance of 0 triggers a latch-enabling signal to record the level of Vref2b_max, or V'ref2b_max−Vthn, which corresponds to the boundary between regions A and B. If the step size of Vref2 is $\Delta V$, GNDmax can be approximated by the average of (Vref2b_max+$\Delta V$+Vthn) and (Vref2b_max+Vthn), which equals [Vref2b_max+Vthn+($\Delta V$/2)].

On the other hand, in order to detect GNDmin, the reference voltage Vref2 is initially set to 0 (low), where V'ref2<<GNDmin, so that NP is always 0 in region C. As V'ref2 is adjusted upward step by step to just above GNDmin, a first 1 pulse will appear on the output node NP. This first appearance of 1 triggers a latch-enabling signal to record the level of Vref2b_min, or V'ref2b_min−Vthn, which corresponds to the boundary between regions B and C. If the step size of Vref2 is $\Delta V$, GNDmin can be approximated by the average of (Vref2b_min−$\Delta V$+Vthn) and (Vref2b_min+Vthn), which equals [Vref2b_min+Vthn−($\Delta V$/2)]. The resulting range of GND noise fluctuations can be calculated from (GNDmax−GNDmin), which equals (Vref2b_max−Vref2b_min+$\Delta V$).

(B) Hierarchical Noise-monitoring System

FIG. 8 is a high level block circuit diagram of a noise-monitoring system, comprising a noise monitor controller, a reference voltage generator, a voltage monitor and noise-level latch, and a memory storage unit. The noise monitor controller receives signals from a high level BIST and external tester and sends control signals to the reference voltage generator and the voltage monitor. The reference voltage generator provides a set of reference voltages for the voltage monitor to determine the noise level of VDD and GND. The noise data are then latched and stored in the memory to be scanned out. Depending on the switching condition and the periodicity of the noise, the measurement period can be adjusted in multiples of the clock cycle time to collect not only the high-frequency noise data, but also the mid-frequency and low-frequency noise data.

The noise-monitoring system can be further implemented in a hierarchical manner for system-on-chip design. FIG. 9A shows an in-core noise-monitoring system for a core A, wherein a plurality of noise analyzer units NAU measure the local power supply noise. Control and data lines are routed to each NAU in the core, similar to those of a scan chain. The measured noise data are then latched in the local NAU and scanned out sequentially. FIG. 9B shows an alternative embodiment of an in-core noise-monitoring system for a core B, wherein a plurality of noise analyzer units NAU measure the local power supply noise. The reference voltages are generated by a local built-in-self-test unit LBIST to reduce the circuit size and power consumption of the NAU.

FIG. 10A shows a system-on-chip (SOC) noise analyzer protocol, comprising 6 cores and a global built-in-self-test unit GBIST. The global BIST unit GBIST sends control signals through a control wire 320 to the local built-in-self-test unit LBIST of each core. The noise data are then scanned out from the data wire 310 and stored in the memory buffer 340 inside the GBIST. FIG. 10B shows an alternative embodiment of an SOC noise analyzer protocol 400 that employs an existing memory core 450 to store the noise data.

While several embodiments and variations of the present invention for a hierarchical power supply noise monitoring device and system for very large scale integrated circuits are described in detail herein, it should be apparent that the disclosure and teachings of the present invention will suggest many alternative designs to those skilled in the art.

Having thus described our invention, what we claim as new and desire to secure by Letters Patent is:

1. A hierarchical power supply noise monitoring system for a very large scale integrated circuit on a chip comprising:
   a plurality of noise-monitoring units fabricated on-chip to measure the noise on the chip and distributed strategically inside macros and cores across the chip;
   each on-chip noise analyzer unit (NAU) measures the noise characteristics of signal lines or power supply voltage lines or ground voltage on the chip, and each NAU is controlled by a higher level built-in-self-test (BIST) unit or an external tester.

2. The system of claim 1, wherein each NAU comprises a source of reference voltages, a noise monitoring device and a noise data latch, and the supply voltage (VDD) and ground voltage (GND) are monitored by the noise-monitoring device and compared to the reference voltages, the reference voltages are controlled by a first control signal, and the output data are latched upon receiving a second control signal.

3. The system of claim 2, wherein each NAU comprises a reference voltage generator for supplying the reference voltages.

4. The system of claim 2, including an external shared reference voltage generator for supplying the reference voltages which is shared between a plurality of NAUs.

5. The system of claim 2, wherein a voltage differential between VDD and ground is measured.

6. The system of claim 2, wherein each noise-monitoring device comprises a supply noise monitor (SNM) generating a noise pulse output NP, a ground noise monitor (GNM), two voltage reference levels (Vref1 and Vref2), and two sampling latches (S/L 1 and S/L 2), the power supply voltage VDD is monitored by the SNM and measured against the reference voltage Vref1, the ground voltage GND is monitored by the GNM and measured against the reference voltage Vref2, voltage supply noise pulses generated by the SNM are sampled by the latch S/L1, and ground noise pulses generated by the GNM are sampled by the latch S/L2.

7. The system of claim 6, wherein the supply noise monitor SNM comprises a strong pMOS device and a weak nMOS device that are connected as an inverter, where the source and the body of the pMOS device are connected to Vref1, the source and the body of the nMOS device are connected to GND, the gates of the pMOS and nMOS devices are connected to VDD, and the drains of the pMOS and nMOS devices are connected to the noise pulse output NP, by defining V'ref1=Vref1−Vthp, where Vthp is the threshold voltage of the pMOS device, if the VDD input is higher than V'ref1, the pMOS device is turned off, the nMOS device is turned on, and the NP output is GND, and if VDD drops below V'ref1, the pMOS device is turned on by switching from weak inversion to strong inversion, and the NP output changes to Vref1 because the pMOS device is designed to overpower the nMOS device.

8. The system of claim 7, wherein as the levels of the reference voltage Vref1 are adjusted, the SNM output NP is generated in one of three distinct regions A, B, C, where NP is always 1 (high) in region A, always 0 (low) in region C, and alternates between 0 and 1 in region B, when V'ref1=Vref1−Vthp is greater than a maximum supply voltage VDDmax, the output NP remains in region A and is always 1, when V'ref1 is less than the minimum supply voltage VDDmin, the output NP remains in region C and is always 0, and VDDmax is identified by sweeping Vref1 through the boundary between region A and region B, and VDDmin is identified by sweeping Vref1 through a boundary between region B and region C, and the width of region B, VDDmax−VDDmin, defines the range of VDD noise fluctuations.

9. The system of claim 8, wherein the noise pulse output signal NP from the supply noise monitor SNM is an input to the sampling latch S/L 1, which triggers write-enable signals when the boundaries between regions A, B, and C are reached, and the write-enable signals enable recording of the VDDmax and VDDmin values into the memory, based on corresponding Vref1 levels at the boundaries.

10. The system of claim 9, including a set-reset sampling latch to detect and record the boundary between regions A and B, as well as the boundary between regions B and C, the output NP of the supply noise monitor SNM forms a SET input to two set-reset sampling latches SR-1, SR-2, the outputs of which are input to two AND gates AND1, AND2, the second input to the first AND gate AND1 is a first reference signal which is adjusted upward step by step, the second input to the second AND gate AND2 is a second reference signal which is adjusted downward step by step, the first AND gate AND1 generates a VDDmin write-enable signal, and the second AND gate AND2 generates a VDDmax write-enable signal.

11. The system of claim 8, wherein to detect VDDmax, the reference voltage Vref1 is initially set to 1 (high), where V'ref1>>VDDmax, so that NP is always 1 in region A, and as V'ref1 is adjusted downward step by step to just below VDDmax, a first 0 pulse will appear on the output NP, and a first appearance of 0 triggers a latch-enable signal to record the level of Vref1b_max, or V'ref1b_max+Vthp, which corresponds to the boundary between regions A and B, and if the step size of Vref1 is ΔV, VDDmax is approximated by the average of (Vref1b_max+ΔV−Vthp) and (Vref1b_max−Vthp), which equals [Vref1b_max−Vthp+(ΔV/2)].

12. The system of claim 8, wherein to detect VDDmin, the reference voltage Vref1 is initially set to 0 (low), where V'ref1<<VDDmin, so that NP is always 0 in region C, and as V'ref1 is adjusted upward step by step to just above VDDmin, a first 1 pulse will appear on the output node NP, and a first appearance of 1 triggers a latch-enable signal to record the level of Vref1b_min, or V'ref1b_min+Vthp, which corresponds to the boundary between regions B and C, and if the step size of Vref1 is ΔV, VDDmin is approximated by the average of (Vref1b_min−ΔV−Vthp) and (Vref1b_min−Vthp), which equals [Vref1b_min−Vthp−(ΔV/2)].

13. The system of claim 6, wherein the ground noise monitor GNM comprises a strong nMOS device and a weak pMOS device that are connected as an inverter, where the source and the body of the pMOS device are connected to VDD, the source and the body of the nMOS device are connected to Vref2, the gates of the pMOS and nMOS devices are connected to GND, and the drains of the pMOS and nMOS devices are connected to the noise pulse output NP, and the nMOS device is designed with stronger driving power than the pMOS device, and by defining V'ref2=Vref2+Vthn, where Vthn is the threshold voltage of the nMOS device, if the GND input is lower than V'ref2, the nMOS device is turned off, the pMOS device is turned on, and the NP output is VDD, and if GND rises above V'ref2, the nMOS device is turned on by switching from weak inversion to strong inversion, and the NP output changes to Vref2 because the nMOS device is designed to overpower the pMOS device.

14. The system of claim 13, wherein as the levels of the reference voltage Vref2 are adjusted, the GNM output NP is generated in one of three distinct regions, where NP is always 1 (high) in region A, always 0 (low) in region C, and alternates between 0 and 1 in region B, and when V'ref2=Vref2+Vthn is greater than the maximum ground voltage GNDmax, the output NP remains in region A and is a 1, when V'ref2 is less than the minimum supply voltage GNDmin, the output NP remains in region C and is a 0, and GNDmax is identified by sweeping Vref2 through the boundary between region A and region B, and GNDmin is identified by sweeping Vref2 through the boundary between region B and region C, and the width of region B, GNDmax−GNDmin, defines the range of GND noise fluctuations.

15. The system of claim 14, wherein to detect GNDmax, the reference voltage Vref2 is initially set to 1 (high), where V'ref2>>GNDmax, so that NP is always 1 in region A, as V'ref2 is adjusted downward step by step to just below GNDmax, a first 0 pulse will appear on the output node NP, and a first appearance of 0 triggers a latch-enabling signal to record the level of Vref2b_max, or V'ref2b_max−Vthn, which corresponds to the boundary between regions A and B, and if the step size of Vref2 is ΔV, GNDmax is approximated by the average of (Vref2b_max+ΔV+Vthn) and (Vref2b_max+Vthn), which equals [Vref2b_max+Vthn+(ΔV/2)].

16. The system of claim 14, wherein to detect GNDmin, the reference voltage Vref2 is initially set to 0 (low), where V'ref2<<GNDmin, so that NP is always 0 in region C, and as V'ref2 is adjusted upward step by step to just above GNDmin, a first 1 pulse will appear on the output node NP, and a first appearance of 1 triggers a latch-enabling signal to record the level of Vref2b_min, or V'ref2b_min−Vthn, which corresponds to a boundary between regions B and C, and if the step size of Vref2 is ΔV, GNDmin is approximated by the average of (Vref2b_min−ΔV+Vthn) and (Vref2b_min+Vthn), which equals [Vref2b_min+Vthn−(ΔV/2)].

17. The system of claim 1, further comprising a noise monitor controller, a reference voltage generator, a voltage monitor and noise-level latch, and a memory, the noise monitor controller receives signals from a high level BIST or an external tester and sends control signals to the reference voltage generator and the voltage monitor, the reference voltage generator provides a set of reference voltages for the voltage monitor to determine the noise level of VDD and GND, the noise data are then latched and stored in the memory.

18. The system of claim 17, wherein a measurement period is adjusted in multiples of a clock cycle time to collect mid-frequency and low-frequency noise data.

19. The system of claim 1, wherein control and data lines are routed to each NAU in a core, measured noise data are latched in each NAU and scanned out sequentially.

20. The system of claim 1, including an in-core noise-monitoring system for a core wherein a plurality of NAUs measure local power supply noise, and reference voltages are generated by a local built-in-self-test unit LBIST.

21. A noise-monitoring unit fabricated on-chip, for a very large scale integrated circuit on the chip, to measure the noise on the chip inside a macro or core of the chip, comprising:
an on-chip noise analyzer unit (NAU) measures the noise characteristics of signal lines or power supply voltage lines or ground voltages on the chip, and is controlled by a higher level built-in-self-test (BIST) unit or an external tester;
a source of reference voltages, a noise monitoring device and a noise data latch, and the supply voltage (VDD) and ground voltage (GND) are monitored by the noise-monitoring device and compared to the reference voltages, the reference voltages are controlled by a first control signal, and the output data are latched upon receiving a second control signal.

22. The NAU of claim 21, further comprising a reference voltage generator for supplying the reference voltages.

23. The NAU of claim 21, wherein the NAU measures a voltage differential between VDD and ground.

24. The system of claim 21, wherein the noise-monitoring device comprises a supply noise monitor (SNM) generating a noise pulse output NP, a ground noise monitor (GNM), two voltage reference levels (Vref1 and Vref2), and two sampling latches (S/L 1 and S/L 2), the power supply voltage VDD is monitored by the SNM and measured against the reference voltage Vref1, the ground voltage GND is monitored by the GNM and measured against the reference voltage Vref2, voltage supply noise pulses generated by the SNM are sampled by the latch S/L1, and ground noise pulses generated by the GNM are sampled by the latch S/L2.

* * * * *